(12) United States Patent
Farmer et al.

(10) Patent No.: US 8,803,132 B2
(45) Date of Patent: Aug. 12, 2014

(54) SELF-ALIGNED DOUBLE-GATE GRAPHENE TRANSISTOR

(71) Applicant: International Business Machines Corporation, Armonk, NY (US)

(72) Inventors: Damon B. Farmer, White Plains, NY (US); Aaron D. Franklin, Croton on Hudson, NY (US); Joshua T. Smith, Croton on Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/971,071

(22) Filed: Aug. 20, 2013

(65) Prior Publication Data

US 2014/0151643 A1 Jun. 5, 2014

Related U.S. Application Data

(63) Continuation of application No. 13/693,700, filed on Dec. 4, 2012.

(51) Int. Cl.
*H01L 29/06* (2006.01)
*H01L 29/16* (2006.01)
*H01L 29/786* (2006.01)
*H01L 29/66* (2006.01)

(52) U.S. Cl.
CPC ....... *H01L 29/1606* (2013.01); *H01L 29/78684* (2013.01); *H01L 29/66015* (2013.01); *Y10S 977/734* (2013.01)
USPC .............. 257/29; 257/E29.264; 257/E51.038; 257/E51.039; 977/734

(58) Field of Classification Search
CPC ............... H01L 29/1606; H01L 29/78684; H01L 29/7781; H01L 21/02527
USPC ............. 438/283; 257/29, E29.264, E21.221, 257/E21.223, E21.232, E51.038, E51.039; 216/81; 977/734
See application file for complete search history.

(56) References Cited

U.S. PATENT DOCUMENTS

| | | | |
|---|---|---|---|
| 6,891,227 B2 | 5/2005 | Appenzeller et al. |
| 7,253,434 B2 | 8/2007 | Golovchenko et al. |
| 7,646,045 B2 | 1/2010 | Kreupl et al. |
| 7,714,386 B2 | 5/2010 | Pesetski et al. |
| 7,952,088 B2 | 5/2011 | Anderson et al. |
| 8,003,453 B2 | 8/2011 | Avouris et al. |
| 8,008,160 B2 | 8/2011 | Cheng et al. |
| 8,097,515 B2 | 1/2012 | Bangsaruntip et al. |

(Continued)

OTHER PUBLICATIONS

P. Avouris, et al., "Progress in Carbon Nanotube Electronics and Photonics," MRS Bulletin, vol. 35, Issue 4, Apr. 2012, pp. 306-313.

(Continued)

*Primary Examiner* — Kimberly Rizkallah
*Assistant Examiner* — Maria Ligai
(74) *Attorney, Agent, or Firm* — Cantor Colburn LLP; Vazken Alexanian

(57) ABSTRACT

A method of fabricating a semiconducting device is disclosed. A graphene sheet is formed on a substrate. At least one slot is formed in the graphene sheet, wherein the at least one slot has a width that allows an etchant to pass through the graphene sheet. An etchant is applied to the substrate through the at least one slot formed in the graphene sheet to etch the substrate.

20 Claims, 5 Drawing Sheets

(56) References Cited

U.S. PATENT DOCUMENTS

| | | | |
|---|---|---|---|
| 8,106,383 B2 | 1/2012 | Jenkins et al. | |
| 8,173,993 B2 | 5/2012 | Bangsaruntip et al. | |
| 8,288,759 B2 | 10/2012 | Chen et al. | |
| 2004/0043527 A1 | 3/2004 | Bradley et al. | |
| 2009/0149012 A1 | 6/2009 | Brask et al. | |
| 2009/0160009 A1 | 6/2009 | Dietz et al. | |
| 2009/0224230 A1 | 9/2009 | Pesetski et al. | |
| 2010/0038628 A1 | 2/2010 | Afzali-Ardakani et al. | |
| 2010/0099815 A1 | 4/2010 | Rinzler et al. | |
| 2011/0309334 A1 | 12/2011 | Chang et al. | |
| 2012/0007054 A1 | 1/2012 | Chang et al. | |
| 2012/0034419 A1* | 2/2012 | Washburn et al. | 428/138 |
| 2012/0056161 A1 | 3/2012 | Avouris et al. | |
| 2012/0175594 A1 | 7/2012 | Chen et al. | |
| 2012/0228557 A1 | 9/2012 | Shin et al. | |
| 2012/0292602 A1 | 11/2012 | Guo et al. | |
| 2012/0298949 A1 | 11/2012 | Chang et al. | |
| 2012/0326126 A1 | 12/2012 | Chen et al. | |
| 2013/0285092 A1* | 10/2013 | Wei et al. | 257/98 |

OTHER PUBLICATIONS

J. Chen, et al., "Charge Transferred Doping and Electroluminscence in Carbon Nanotube Transistors," 5th IEEE Conference on Jul. 11-15, 2005, vol. 1, pp. 422-425.

R. Cheng, et al., "High-Frequency Self-Aligned Graphene Transistors with Transferred Gate Stacks," PNAS, vol. 109, No. 29, Jul. 17, 2012, pp. 11588-11592.

L. Ding, et al., "Self-Aligned U-Gate Carbon Nanotube Field-Effect Transistor with Extremely Small Parasitic Capacitance and Drain-Induced Barrier Lowering," ACS Nano, vol. 5, 2011, pp. 2512-2519.

D. Farmer, et al., "Graphene Field-Effect Transistors with Self-Aligned Gates," Applied Physics Letters, vol. 97, Issue 1, 2010, 013103, 3 pages.

A. Franklin, et al., "Double Contacts for Improved Performance of Graphene Transistors," IEEE Electron Device Letters, vol. 33, Issue 1, Jan. 2012, pp. 17-19.

A. Franklin, et al., "Contacts-First Self-Aligned Carbon Nanotube Transistor with Gate-All-Around," U.S. Appl. No. 13/584,199, filed Aug. 13, 2012.

Z Hailiang, et al., "Performance Optimization of MOS-Like Carbon Nanotube-FETs with Realistic Source/Drain Contacts Based on Electrostatic Doping," vol. 31, No. 12, 2010, 124005, 6 pages.

S. Koswatta, et al., "Computational Study of Carbon Nanotube p-i-n Tunnel FETs," IEEE International Electron Devices Meeting, 2005. IEDM, 5-5 Dec. 2005, pp. 518-521.

Kovacs, et al., "Bulk Micromachining of Silicon," Proceedings of the IEEE, vol. 86, Issue 8, Aug. 1998, pp. 1536-1551.

L. Liao, et al., "High-Speed Graphene Transistors with a Self-Aligned Nanowire Gate," Nature, vol. 467, 2010, pp. 305-308.

A. Zhang, et al., "Self-Aligned Ballistic n-Type Single-Walled Carbon Nanotube Field-Effect Transistors with Adjustable Threshold Voltage," Nano Lett., vol. 8, 2008, pp. 3696-3701.

A. Franklin et al.,; Scalable and Fully Self-Aligned n-Type Carbon Nanotube Transistors with Gate-All-Around, 2012 IEEE International Electron Devices Meeting, San Francisco, CA, IEEE, Dec. 10, 2012, pp. 4.5.1-4.5.4.

International Search Report and Written Opinion Dated Jan. 22, 2014 for International Application No. PCT/US13/55270, pp. 1-15.

A. Javey et al., "Self-Aligned Ballistic Molecular Transistors and Electrically Parallel Nanotube Arrays," Nano Letter, vol. 4, 2004, pp. 1319-1322.

* cited by examiner

SELF-ALIGNED DOUBLE-GATE GRAPHENE TRANSISTOR

CROSS REFERENCE TO RELATED APPLICATIONS

The present application is a continuation of U.S. patent application Ser. No. 13/693,700, entitled "SELF-ALIGNED DOUBLE-GATE GRAPHENE TRANSISTOR", filed on Dec. 4, 2012, which is incorporated herein by reference in its entirety.

BACKGROUND

The present invention relates to semiconductor devices and, in particular, to graphene transistors and methods of manufacturing graphene transistors.

Graphene field-effect transistors (GFETs) are suitable for use in high frequency RF applications. Their high carrier mobility and transconductance enables them to deliver performance for applications up to terahertz frequencies. A typical GFET includes a sheet of graphene that electrically connects a source contact and a drain contact. In highly-integrated digital applications, a self-aligned gate structure of a GFET is useful to ensure uniformity of key parameters such as parasitic capacitance. Current methods of forming self-aligned GFETs are generally not scalable for manufacturing purposes or require thin source and drain contacts.

SUMMARY

According to one embodiment, a method of fabricating a semiconducting device includes: forming a graphene sheet on a substrate; forming at least one slot in the graphene sheet having a width that allows an etchant to pass through the graphene sheet; and applying the etchant to the substrate through the at least one slot formed in the graphene sheet to etch the substrate.

According to another embodiment, a method of fabricating a transistor includes: forming a graphene sheet on a substrate; forming one or more contacts on the graphene sheet to define a gap between the one or more contacts; forming at least one slot in the graphene sheet having a width that allows an etchant to pass through the graphene sheet; and removing a portion of the substrate in the gap via passing the etchant through the at least one slot.

According to another embodiment, a method of making a self-aligned graphene transistor including: forming a graphene sheet on a substrate; forming a source contact on the graphene sheet; forming a drain contact on the graphene sheet, wherein the drain contact is separated from the source contact by a gap; forming at least one slot in the graphene sheet having a width that allows an etchant to pass through the graphene sheet; and removing a portion of the substrate in the gap between the source contact and the drain contact via passing the etchant through the at least one slot.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the disclosure is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION

FIGS. 1-6 show various stages of production or manufacture of an exemplary semiconductor device according to embodiments of the present invention. In an exemplary embodiment, the semiconductor device is a graphene field effect transistor (GFET) having a dual gate structure. The exemplary method of manufacturing the GFET disclosed herein may produce self-aligned GFETs as a result of depositing the source and drain contacts prior to gate formation, and forming the gate with respect to the deposited source and drain contacts. The source and drain contacts provide a mask with respect to etchant used in gate formation. The substrate is oriented with respect to the source contact and the drain contact such that the substrate may be anisotropically etched in a selected direction that defines at least one dimension of the gate region. Additionally, the gate region includes a graphene bridge that extends between source and drain contacts. Cuts or slots in the graphene sheet enable etching of the substrate underneath the graphene. The gate material is deposited on opposing faces of the graphene bridged during the manufacturing process.

Figure 1:
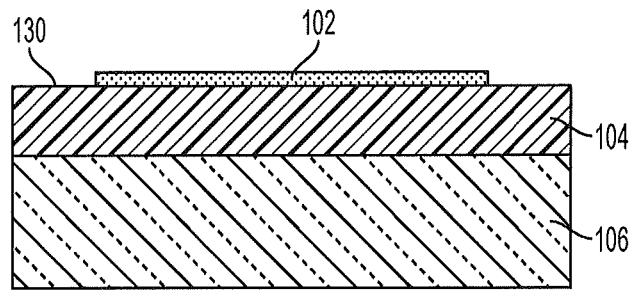
FIG. 1 illustrates an initial production stage of an exemplary graphene field effect transistor of the present invention in which a graphene sheet is placed on a substrate.

FIG. 1 shows an exemplary graphene sheet 102 placed at a selected location on a substrate in an initial production stage of the exemplary GFET. In the exemplary embodiment, the substrate may be a silicon-on-insulator (SOI) wafer that includes a top layer or silicon substrate 104 on top of an insulating layer such as a BOX (buried oxide) layer 106 that may include silicon-dioxide. The graphene sheet 102, which serves as a transistor device channel upon completion of the GFET, is deposited on surface 130 of the silicon layer 104. In various embodiments, the graphene 102 is a semiconducting material. In an exemplary embodiment, the substrate is formed so that crystallographic axes of the substrate are aligned along selected directions, as explained below.

Figure 2:
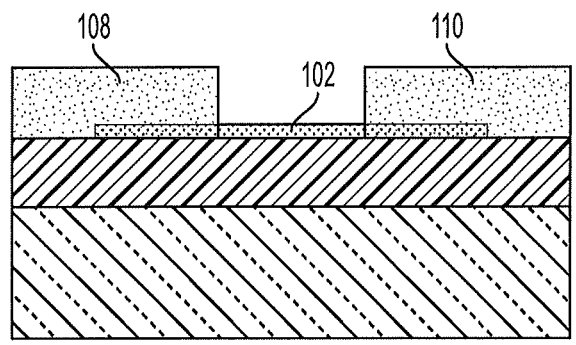
FIG. 2 shows a first contact and a second contact formed on a substrate in a second production stage of the exemplary graphene field effect transistor.

FIG. 2 shows a first contact 108 and a second contact 110 formed on the silicon substrate 104 in a second production stage. Each of the first contact 108 and the second contact 110 may be deposited on the silicon substrate 104 to cover a portion of the graphene sheet 102 between the contact and the silicon substrate 104. The first contact 108 and the second contact 110 are separated by a selected distance or gap that defines a gate region of the completed GFET. The first contact 108 and second contact 110 may be formed on the silicon substrate 104 using various techniques for aligning the transistor contacts at selected distance or gap. An exemplary method of forming the first contact 108 and the second contact 110 may include using lithography and lift-off techniques. Alternately, a blanket layer of contact material may be deposited and the selectively etched. In an exemplary embodiment, one of the first contact 108 and the second contact 110 is a source contact of the completed GFET and the other of the first contact 108 and the second contact 110 is a drain contact of the completed GFET. In one embodiment, at least one of the first contact 108 and second contact 110 includes a conductive metal such as palladium (Pd).

Figure 3:
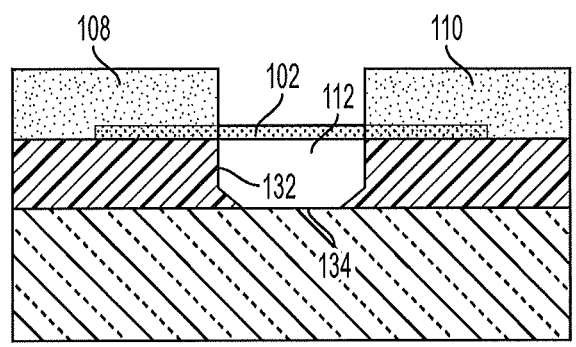
FIG. 3 illustrates a substrate etching stage.

FIG. 3 shows a recess 112 formed in the silicon substrate 104 in the gate region defined by the first contact 108 and the second contact 110. In various embodiments, the surface 130 of the substrate 104 is a surface that can be effectively etched using a wet etchant. For a silicon layer, an exemplary surface may be a (110) surface, wherein (110) represents Miller indices denoting a direction of a crystallographic plane or surface. A surface 132 that is perpendicular to the (110) surface (such as a (111) surface) is also shown. Wet etchant generally dissolves surface 130 relatively effectively, while surface 132 is generally resistant to wet etching. Thus, etchant applied in the gate region anisotropically etches the silicon substrate 104 to produce a recess that has relatively vertical wall. In order to achieve this anisotropic etching, the silicon substrate 104 may be oriented so that a fast-etching direction (i.e., the 110 surface) is directed away from the surface of the substrate and a slow-etching direction (i.e., the 111 surface) is directed perpendicular to the surface of the silicon substrate 104. Exemplary wet etchants include potassium hydroxide (KOH), tetramethylammonium hydroxide (TMAH), etc. The first contact 108 and second contact 110 provide an etch mask that protects the silicon substrate 104 beneath the contacts during etching. Applying the contacts 108 and 110 prior to wet etching allows the contacts to define the gate region of the resulting transistor by the selected separation distance of the contacts 108 and 110 and to produce a self-aligned gate. Wet etching therefore creates a recess 112 in a volume between the contacts. In an exemplary embodiment, the recess 112 is etched to the surface 134 of the insulator layer 106. Etching the recess 112 yields a suspended portion of the graphene sheet in the gate region, referred to herein as a graphene bridge or graphene channel that extends from the first contact 108 to the second contact 110.

Figure 9:
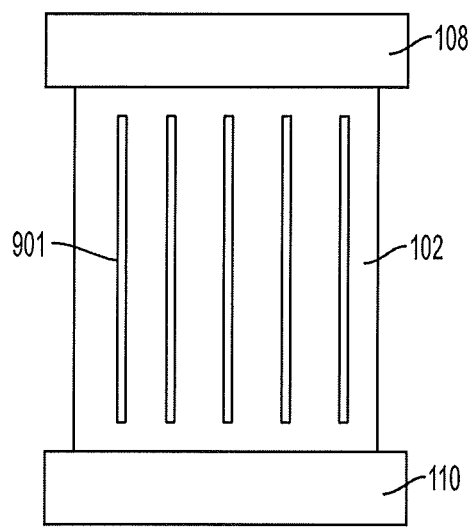
FIG. 9 shows a top view of a graphene sheet having exemplary slots for allowing molecules to pass through the graphene sheet.

In order to allow wet etchant to reach the substrate lying beneath the graphene sheet, slots or cuts may be made in the graphene sheet 102. FIG. 9 shows a top view of the graphene sheet 102 with exemplary cuts (slots) 901 for allowing molecules to pass through the graphene sheet 102. In an exemplary embodiment, a width of the slots 901 allows etchant molecules to pass through the slots, thereby passing from a top side of the graphene sheet 102 to the substrate beneath the graphene sheet 102. In an exemplary embodiment, the width of the slots 901 is from about 5 nanometers (nm) to about 100 nm and the slots may be separated by about 1 micron. The slots may be created in the graphene sheet 102 by depositing a resist layer on the graphene, using lithography to create slots in the resist layer and then using an oxygen plasma to etch away the graphene in the slots opened in the resist layer. The resist layer may then be removed. During the wet etching process, the etchant passes through the slots 901 to reach the silicon substrate 104 and etch the silicon substrate 104 from beneath the graphene sheet 102. In subsequent manufacturing stages, the slots 901 allow other metals and material to pass through the graphene sheet 102 for deposition at surfaces underneath the graphene sheet 102.

Figure 4:
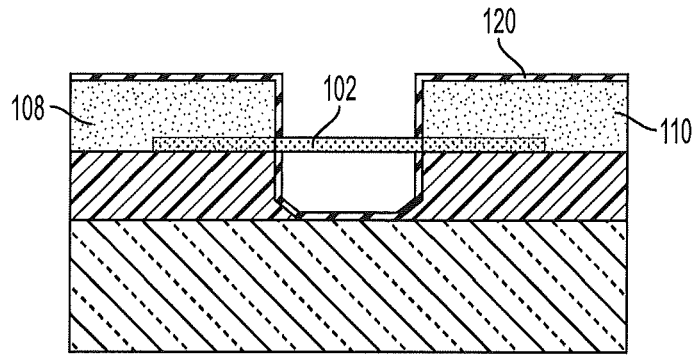
FIG. 4 illustrates a coating stage in which a spacer material is deposited.

FIG. 4 illustrates a coating stage in which a spacer material 120 is deposited. The spacer material 120 is deposited on the exposed surfaces to provide an insulating layer between a subsequently formed gate material and the first and second contacts 108 and 110. The spacer material 120 may pass through the slots 901 to coat surfaces underneath the graphene bridge 102. The spacer material 120 may be a low-k dielectric material, wherein k is a dielectric constant. Exemplary spacer material 120 may include $SiO_2$ and SiCOH among others. In general, the spacer material 120 adheres to the contacts 108 and 110 as well as to the substrate 104 and BOX layer 106 but does not adhere to the graphene bridge during deposition. The spacer 120 may be formed using atomic layer deposition (ALD) or chemical vapor deposition (CVD), for example.

Figure 5:
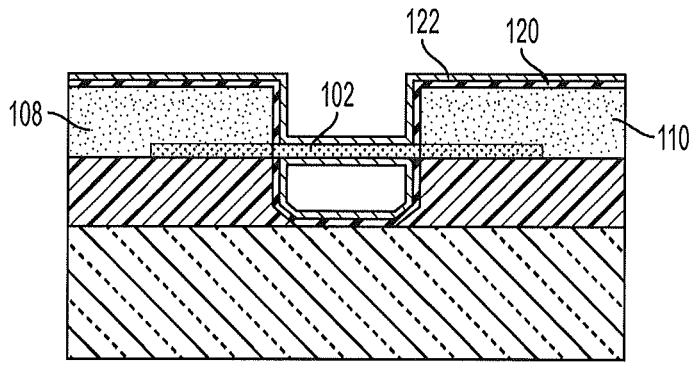
FIG. 5 shows a high-k gate dielectric deposition stage.

FIG. 5 shows a stage in which a high-k dielectric material 122 is deposited. The high-k dielectric material 122 is deposited to conform to the exposed surfaces of the spacer 120 and the graphene bridge 102. The high-k dielectric material 122 may pass through the slots 901 to coat surfaces underneath the graphene bridge 102. The high-k dielectric material 122 may nucleate on a top surface of the graphene bridge 102 and a bottom surface of the graphene bridge 102 in the gate region between the first contact 108 and the second contact 110, thereby providing a dual gate structure for controlling an operation of the graphene bridge. The high-k dielectric material 122 separates subsequently deposited gate metal (see FIG. 6) from the graphene bridge. The high-k dielectric material 122 may be deposited using, for example, ALD. Exemplary high-k dielectric material 122 may include $HfO_2$ and $Al_2O_3$, among others.

Figure 6:
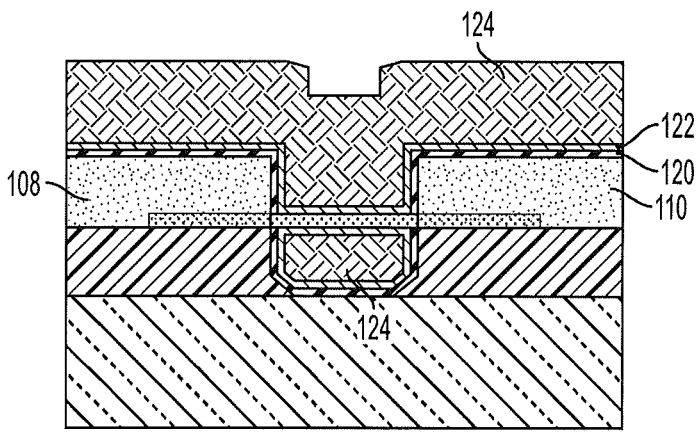
FIG. 6 illustrates a conductive gate deposition stage for building a dual gate transistor structure.

FIG. 6 illustrates a gate deposition stage. A gate metal 124 is deposited after the high-k dielectric material 122 deposition stage. The gate metal 124 may be palladium (Pd), tungsten (W) or other suitable gate metal, for example. The gate metal 124 may be deposited using atomic layer deposition, sputtering techniques or other known techniques or combination of techniques. The gate metal 124 may pass through the slots 901 to fill in the recess underneath the graphene bridge 102. After deposition of the gate metal 124, a portion of the gate metal 124 is disposed in the volume between the first contact 108 and the second contact 110 including the etched recess 112. The gate metal 124 therefore surrounds the graphene bridge 102 on all sides, forming a dual gate transistor. Formation of the dual gate structure is enabled by the presence of the slots 901 in the suspended graphene bridge 102. The dual gate structure reduces an impact of stray charge and/or adsorbed molecules.

Figure 7:
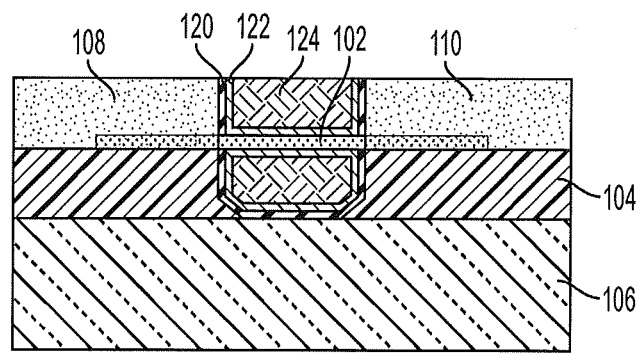
FIG. 7 shows an exemplary graphene field-effect transistor made using the exemplary methods disclosed herein.

During the gate deposition stage, some portion of the deposited gate metal 124 may overfill and reside on top of the high-k dielectric surface that coats the first contacts 108 and second contact 110. After the gate metal is deposited, the gate overfill metal may be polished by chemical mechanical planarization/polishing (CMP) as illustrated in FIG. 7, so that the overfilled metal is removed to reveal top surfaces of the first contact (source) 108, the gate 124, and the second contact (drain) 110. In an exemplary embodiment, the top surfaces are coplanar after the CMP process.

Figure 8:
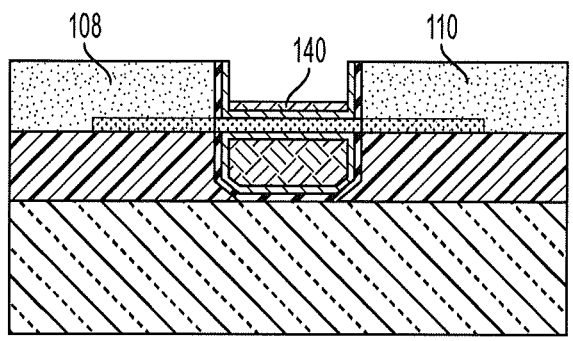
FIG. 8 shows an alternative embodiment of a graphene field-effect transistor made using the exemplary methods disclosed herein.

FIG. 7 thus depicts an exemplary graphene field-effect transistor made using the exemplary methods disclosed herein. The exemplary GFET includes a silicon substrate 104 on an insulating (BOX) layer 106 and having a graphene sheet 102 disposed directly thereon. A first (source) contact 108 and a second (drain) contact 110 are disposed on the substrate 104 so that each contact covers a portion of the graphene sheet 102 between the contact and the silicon substrate 104. The first contact and the second contact are separated by a gap having a selected distance. In various embodiments, the selected distance may be about 30 nanometers. A portion of the graphene sheet 102 spans the distance between the first contact 108 and the second contact 110 to form a graphene bridge or graphene channel. A gate metal 124 is deposited in an etched recess between the first contact 108 and the second contact 110 in order 50 surround the graphene bridge 102, thereby providing a dual gate graphene transistor. Since the formation of the gate region is defined by the source 108 and the drain 110, the transistor is self-aligned. In various embodiments, the gate metal 124 extends to an insulating layer 106. Additionally, the graphene bridge 102 may be surrounded on both faces by a high-k dielectric material 122 that is formed between the graphene bridge 102 and the gate metal 124. In an exemplary embodiment, the surfaces of the source contact 108, gate metal 124 and drain contact 110 are substantially coplanar. In an alternate embodiment, some of the gate metal 124 may be etched so that a top surface 140 of the gate metal is recessed below the top surface defined by the source 108 and drain 110, as shown in FIG. 8. Recessing the top surface 140 may reduce parasitic capacitances associated with the gate.

In various alternative embodiments, the contacts may be made to be thin upon their deposition. The contacts may then be topped by a layer of low-k dielectric material, which is then polished away during the polishing of the gate metal overfill. In another alternative embodiment, the step of depositing low-k spacer material may be skipped. Instead, high-k dielectric may be deposited in its place to serve as both a spacer metal and a gate dielectric. In this alternate embodiment, the high-k dielectric may thus coat the graphene bridge to conform to the graphene bridge.

Figure 10:
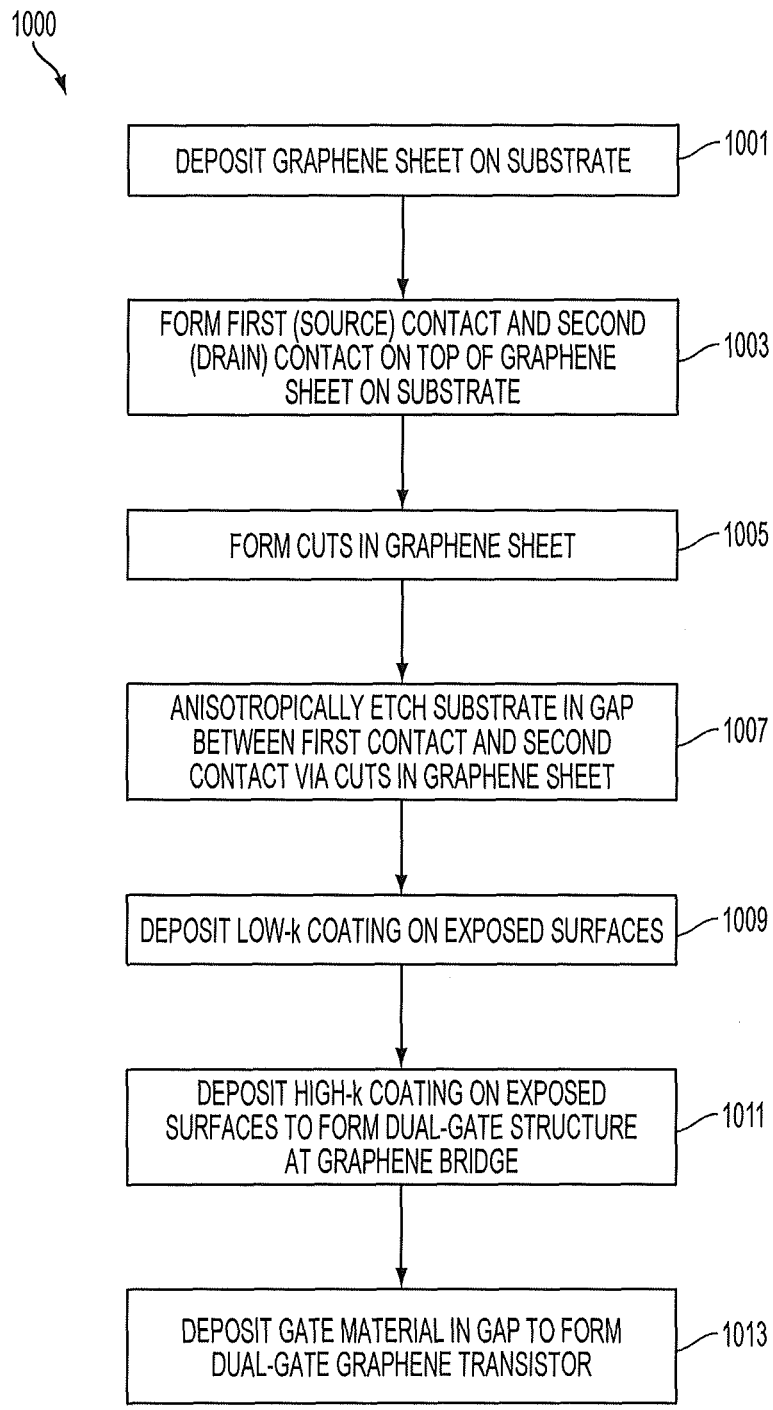
FIG. 10 shows a flowchart illustrating an exemplary method of producing the exemplary graphene field effect transistor disclosed herein.

FIG. 10 shows a flowchart 1000 illustrating an exemplary method of producing a GFET disclosed herein. In block 1001, a graphene sheet is deposited on a substrate. The substrate generally resides on an insulating layer (BOX layer). In block 1003, source and drain contacts are formed on the substrate. The source and drain contacts are formed on top of portions of the graphene sheet and are separated from each other by a selected distance to provide a gap for deposition of a gate metal. In block 1005, slots are made in the graphene sheet. In block 1007, the substrate between the source and drain contacts are wet etched to create a recess between the source and drain contacts. The wet etching process is facilitated by allowing the etchant to flow through the slots formed in the graphene sheet to the substrate underneath the graphene sheet. The etching process etches the substrate beneath the graphene sheet in the gate region and leaves the graphene sheet to thereby form a graphene bridge between the source and drain. The substrate is etched to the BOX layer in an exemplary embodiment. In box 1009, a low-k material is deposited on the exposed surfaces to provide a spacer between the gate and each of the source and drain contacts. The low-k material may be deposited underneath the graphene sheet via the slots in the graphene sheet. In box 1011, a high-k material is deposited on the exposed surfaces and the graphene bridge to form a dual gate structure surrounding the graphene bridge. The high-k dielectric material may be deposited underneath the graphene sheet via the slots in the graphene sheet. The high-k dielectric material provides an electrical field to the graphene bridge when a voltage is applied at the gate. In box 1013, gate metal is deposited (sputtered) on to the transistor to fill in the recess in the substrate and volume between the source contact and the drain contact. The deposited gate metal forms a dual gate structure at the graphene bridge. The gate metal may be in the recess via the slots in the graphene sheet.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While exemplary embodiments of the invention have been described, it will be understood that those skilled in the art, both now and in the future, may make various improvements and enhancements which fall within the scope of the claims which follow. These claims should be construed to maintain the proper protection for the invention first described.

What is claimed is:

1. A semiconducting device, comprising:
   a graphene sheet formed on a substrate;
   a first contact coupled to the graphene sheet and a second contact coupled to the graphene sheet and separated from the first contact by a gap;
   at least one slot formed in the graphene sheet having a width that allows an etchant to pass through the graphene sheet; and
   a recess formed in the substrate beneath the graphene sheet via etchant passing through the graphene sheet.

2. The semiconducting device of claim 1, wherein the graphene sheet forms a graphene bridge that spans the gap between the first contact and the second contact.

3. The semiconducting device of claim 2, further comprising a gate material disposed on opposing faces of the graphene bridge in the gap.

4. The semiconducting device of claim 3, further comprising a high-k dielectric material disposed on opposing faces of the graphene bridge between the graphene bridge and the gate material.

5. The semiconducting device of claim 3, wherein a surface of the deposited gate material is coplanar with surfaces of the first contact and the second contact.

6. The semiconducting device of claim 3, wherein a surface of the deposited gate material is recessed with respect to the top surfaces of the first contact and the second contact.

7. The semiconducting device of claim 1, wherein the first contact and the second contact provide a self-aligned gate structure of the semiconducting device.

8. The semiconducting device of claim 1, wherein the recess further comprises an anisotropically etched recess.

9. A transistor, comprising:
a graphene sheet disposed directly on a substrate;
two or more contacts formed on the graphene sheet to define a gap between the two or more contacts;
at least one slot in the graphene sheet having a width that allows an etchant to pass through the graphene sheet in the gap; and
a gate material in the gap defined by the one or more contacts, wherein the gate material fills a recess in the gap.

10. The transistor of claim 9, wherein the graphene sheet forms a graphene bridge spanning the gap between the one or more contacts.

11. The transistor of claim 10, wherein the gate material provides a dual gate structure with respect to the graphene bridge.

12. The transistor of claim 11, further comprising a dielectric material disposed on opposing surfaces of the graphene bridge and between the graphene bridge and the gate material.

13. The transistor of claim 11, wherein a surface of the gate material is coplanar with top surfaces of the one or more contacts.

14. The transistor of claim 11, wherein a surface of the gate material is recessed with respect to the top surfaces of the one or more contacts.

15. The transistor of claim 9, wherein the one or more contacts provide a self-aligned gate structure of the transistor.

16. A self-aligned graphene transistor, comprising:
a graphene sheet disposed on a substrate of the graphene transistor;
a source contact on the substrate over the graphene sheet;
a drain contact on the substrate over the graphene sheet, wherein the drain contact is separated from the source contact by a gap;
at least one slot in the graphene sheet having a width that allows an etchant to pass through the graphene sheet; and
a gate region in the gap that includes a recess formed by a passing the etchant through the graphene sheet to remove a portion of the substrate in the gap.

17. The self-aligned graphene transistor of claim 16, wherein the graphene sheet forms a graphene bridge that spans the gap between the source contact and the drain contact.

18. The self-aligned graphene transistor of claim 17, wherein the gate region include a gate material that fills the gap to surround the graphene bridge.

19. The self-aligned graphene transistor of claim 18, further comprising a dielectric material forming a dual gate structure on opposing surfaces of the graphene bridge between the graphene bridge and the gate material.

20. The self-aligned graphene transistor of claim 16, wherein the gate region is defined by anisotropic etching of the substrate in the gap.

* * * * *